United States Patent [19]
Johnson

[11] 4,306,204
[45] Dec. 15, 1981

[54] BANDPASS MECHANICAL FILTER

[75] Inventor: Robert A. Johnson, Tustin, Calif.

[73] Assignee: Rockwell International Corporation, El Segundo, Calif.

[21] Appl. No.: 138,026

[22] Filed: Apr. 7, 1980

[51] Int. Cl.³ .................... H03H 9/50; H03H 9/52; H03H 9/60
[52] U.S. Cl. .................................... 333/189; 333/197
[58] Field of Search ........................... 333/186–192, 333/197–201; 310/316–321

[56] References Cited

U.S. PATENT DOCUMENTS 2,988,714  6/1961  Tehon ........................... 310/318 X
3,983,516  9/1976  Johnson ......................... 333/197 X

OTHER PUBLICATIONS

Kusakabe et al.-"On The Differential Type Mechanical Filter Composed of Two Transverse-Vibrating Bars", (Prior to Mar. 7, 1980); pp. 203-207, 210-218.
Johnson et al.-"Mechanical Filters and Resonators", IEEE Trans. on Sonics and Ultrasonics; vol. SU-21, No. 4, Oct. 1974; pp. 244-256.
Sheahan et al.-"Crystal and Mechanical Filters", IEEE Trans. on Circuits and Systems, vol. CAS-22, No. 2, Feb. 1975; pp. 69-89.

*Primary Examiner*—Marvin L. Nussbaum
*Attorney, Agent, or Firm*—Richard K. Robinson; Howard R. Greenberg; H. Fredrick Hamann

[57] ABSTRACT

A mechanical bandpass filter has a first resonator which is designed to resonate at a first frequency and a second resonator which is designed to resonate at a second frequency. The two resonators are electrically connected together and the input signal is applied to the first resonator and the filtered signal is removed from an electrical connection to the second resonator.

18 Claims, 8 Drawing Figures

BANDPASS MECHANICAL FILTER

BACKGROUND OF THE INVENTION

The invention relates to mechanical bandpass filters and specifically to mechanical filters which employ bar resonators.

Mechanical bandpass filters are known in the Art, especially filters such as the longitudinal mode mechanical bandpass filter disclosed in my U.S. Pat. No. 3,983,516. The disclosed bar resonators operate in a longitudinal mode of vibration and are aligned in parallel array along the longitudinal axis in which they are rigidly joined together by at least two support rods at their aligned nodal planes and at least one coupling rod. Piezoelectric transducers affixed to the longitudinal surfaces of two resonators provide a means for mechanically driving the resonator assembly from an electrical input signal and for extracting an electrical output signal.

In an article published in the IEEE Transactions on Circuits and Systems of Volume CAS-22, No. 2, February, 1975, entitled "Crystal and Mechanical Filters" by Desmond F. Sheahan and Robert A. Johnson, there was disclosed the basic techniques used in the design of crystal and mechanical filters. Similarly, in a paper published by the IEEE Transactions on Sonics and Ultrasonics, Volume SU-21, No. 4, published in October, 1974, entitled "Mechanical Filters and Resonators" by Robert A. Johnson and Alfhart E. Guenther, there was disclosed the circuit equivalent of mechanical filters as well as the description of these circuits. In addition, the basic theory of bar resonator use in mechanical filters was disclosed.

SUMMARY OF THE INVENTION

Conventional acoustically coupled flexure mode, mechanical ladder filters in the 2 KHz to 50 KHz frequency range operate well in the case of narrow band designs, but as a bandwidth increases, spurious response mode effects become more pronounced. The spurious response modes of vibration are rigid body modes which increase in frequency as the stiffness of the acoustic system increases. Specifically, as the acoustic coupling between the resonators increases (due to increasing in the coupling wire diameter, decreasing the coupling wire length or decreasing the bar resonator mass) the frequency of the spurious modes increases. In the case of bandwidths greater than 1% of the center frequency, the rigid body modes move close in frequency to the desired flexure mode frequency (the passband of the filters). This causes unwanted attenuation variations in both the stopband and passband of the filter.

A mechanical bandpass filter that solves the above problem has a first resonator which is designed to resonate at a first frequency and a second resonator which is designed to resonate at a second frequency. The two resonators are electrically connected together and the input signal is applied to the first resonator and the filtered signal is removed from an electrical connection to the second resonator.

Embodiments presented herein provide for electrical coupling of the signal between resonators and the utilization of split-plate or separate plate transducers. The use of simple bar flexure resonators and individual support means with electrical coupling only is disclosed. The addition of tuning inductors to the system provides a wide bandwidth frequency response. In addition, capacitive coupling can be provided which improves the stopband frequency response by realizing attenuating poles in the upper or lower or both stopbands. The capacitive coupling can be achieved by use of the split-plate or separate transducers.

Many advantages of the present invention may be ascertained from a reading of the specification and claims in conjunction with the drawings.

DETAILED DESCRIPTION OF THE INVENTION

Figure 1:
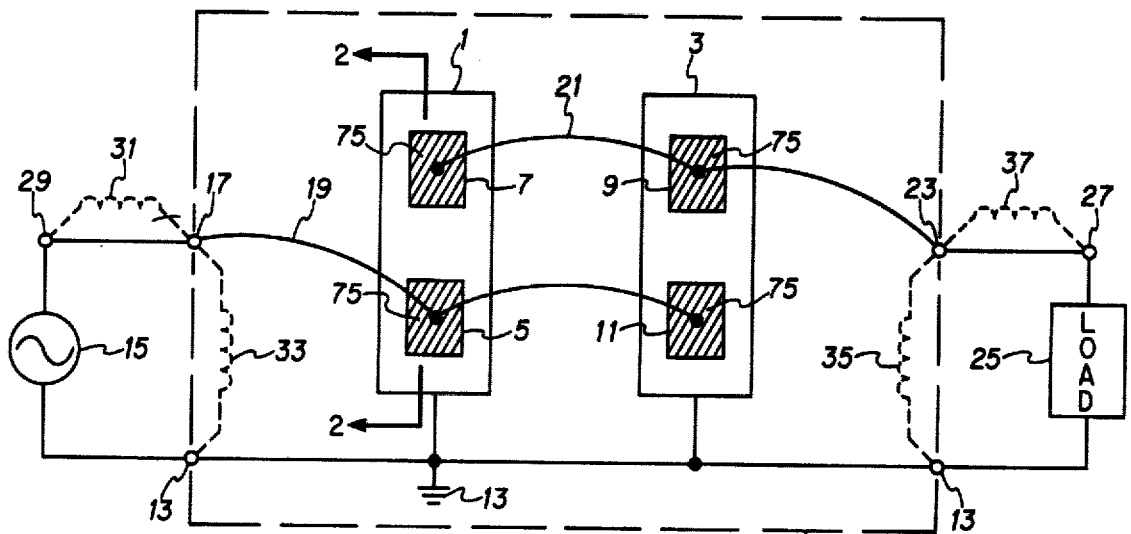
FIG. 1 is a simplified diagram of the mechanical bandpass filter according to the invention.

Reference should be made to FIG. 1 which shows a mechanical passband filter 80 according to the invention. There is a first resonator bar 1 which is designed to resonate at the low passband frequency $f_1$ and a second resonator bar 3 which is designed to resonate at the upper passband frequency $f_2$. Mounted on each resonator bar are two transducers, transducers 5 and 7 are mounted on the resonator bar 1 and transducers 9 and 11 are mounted on the resonator bar 3. Both resonator bars are connected to the common plane or ground plane 13.

In normal operation a signal source 15 with a specified output resistance is applied across the ground plane 13 and the input terminal 17. The input terminal 17 is connected to the transducers 5 and 11 by electrical conductor 19. The transducers 5, 7, 9 and 11 are all piezoelectric-ceramic transducers with conductors 75 on the top and bottom surfaces. The bottom surface of each transducer is affixed to a resonator bar fabricated from a suitable FE-NI metal alloy such as NI-Span C. The bars, of course, are designed to resonate at the selected frequency and the bars are fabricated to resonate at these frequencies.

In response to the input signal from the signal source 15, the transducers 5 and 11 will cause the resonator bars 1 and 3 to resonate or vibrate. The vibration of the resonator bars in turn causes transducers 7 and 9 to generate an electrical signal which is coupled by conductor 21 to output terminal 23. In the circuit application load 25, a resistance is connected to the output terminal 23 and the ground plane 13 and driven by transducers 7 and 9.

It has been found that the bandwidth of the filter can be increased further from approximately 1% of the center frequency to approximately 10% by the addition of tuning coils. In FIG. 1 there is provided additional terminals 27 and 29 so that either series or parallel tuning coil arrangements can be implemented. These optional coils are shown as dotted lines in FIG. 1. In the series arrangement, tuning coil 31 is connected between terminals 29 and input terminal 17 and tuning coil 37 is inserted between output terminal 23 and terminal 27. Of course, the conductor between these terminals would be removed. In the parallel tuning arrangements, the tuning coil 33 is placed in parallel with the signal source 15 by connecting the tuning coil 33 between terminal 17 and ground. Similarly the load would have a parallel tuning coil connected across it by the connection of tuning coil 35 to a terminal 23 and ground plane 13.

Figure 2:
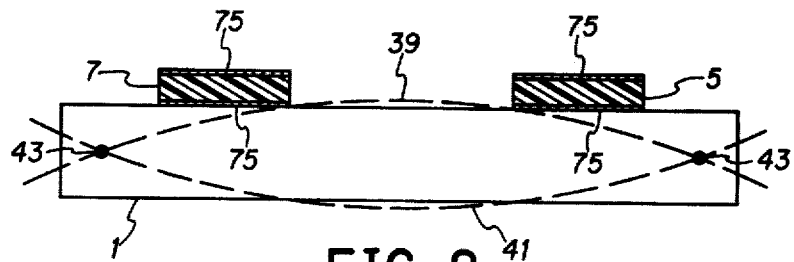
FIG. 2 is a sectional diagram of the bandpass filter of FIG. 1 illustrating the flexure mode of operation.

FIG. 2, to which reference should now be made, is a side view as seen from section line 2 of the resonator bar 1 and illustrates the flexure mode of resonating which means the resonator bar flexes around the nodal points 43 with the dotted lines 39 and 41 illustrating the distance traveled during vibration. This is opposed to the longitudinal mode of resonating disclosed in U.S. Pat. No. 3,983,516. FIG. 2 also illustrates the conductive plates 75 that are affixed to the top and bottom of the transducers.

Traditionally, the coupling of signals between resonator bars has been performed by an acoustical coupling device such as a coupling wire (which in some embodiments also serves as a mounting support for the resonator bars).

Figure 3:
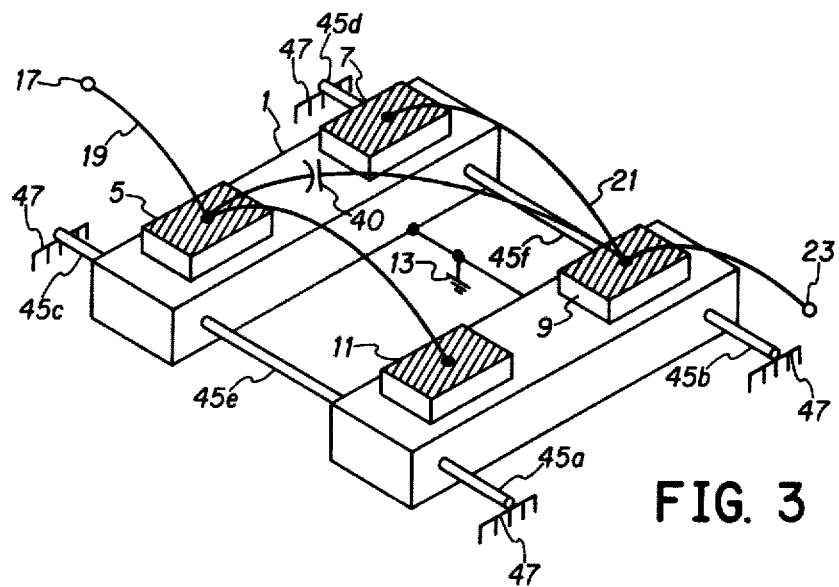
FIGS. 3, 4 and 5 are block diagrams illustrating the different embodiments of the invention.
Figure 8:
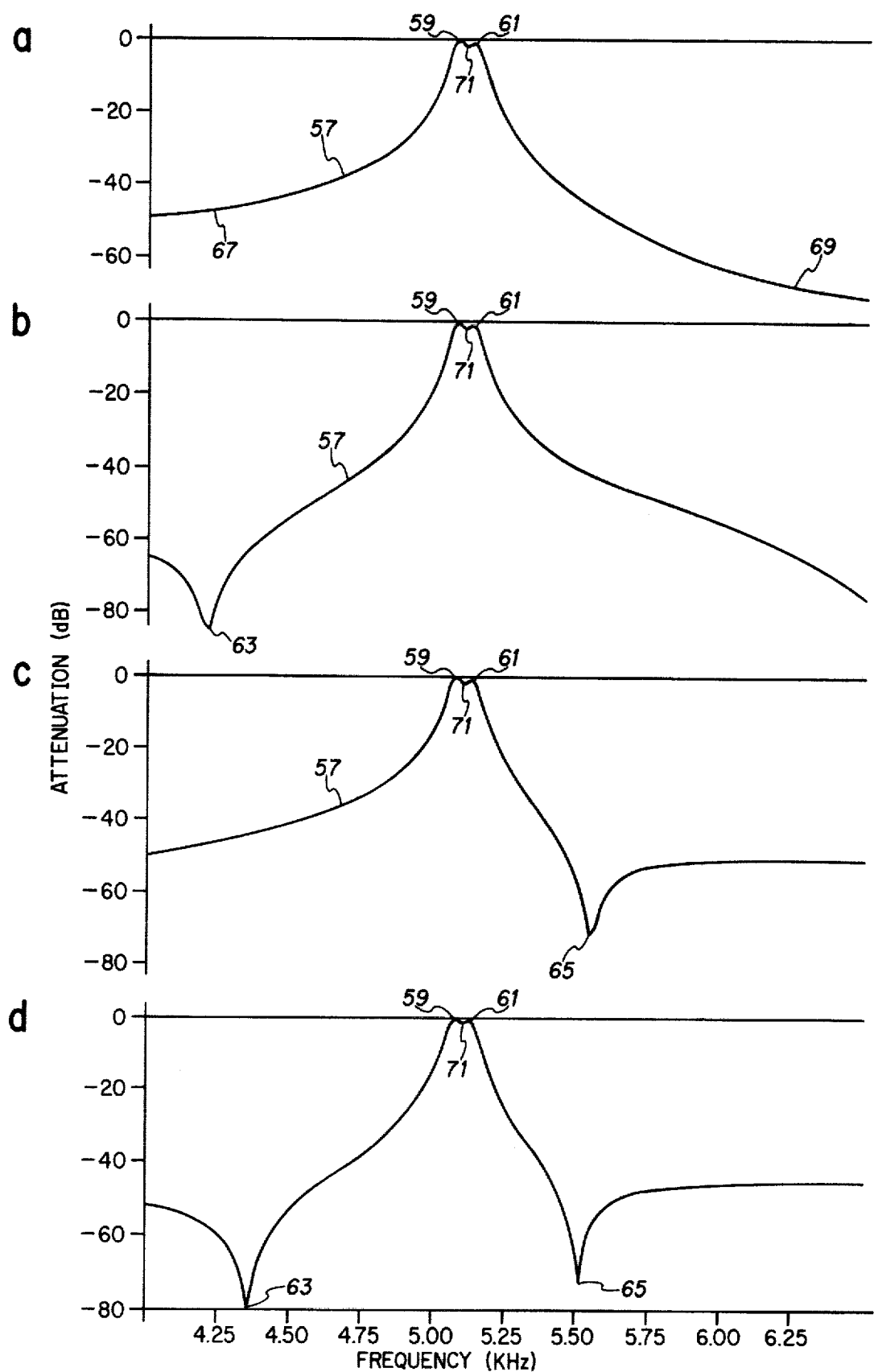
FIG. 8, parts $a$ through $d$, shows the response curves of the different embodiments of the invention.

In FIG. 3 there is shown the use of side support rods 45a, b, c, d, e and f which are connected to the sides of the resonator bars 1 and 3 and in the preferred embodiments these rods are in alignment with the nodal points 43. On the ends of the support rods 45a, b, c and d are mounts 47 which are used for mounting the entire structure to the circuit. Although it is not necessary to provide acoustic coupling between the resonator bar 1 and the resonator bar 3, this function is provided in FIG. 3 by the support rods 45e and f. Electrical coupling is provided by conductors 21 and 19 as was discussed in conjunction with FIG. 1. Capacitor 40 is a bridging capacitor whose function will be discussed in detail in conjunction with FIG. 8d.

Figure 4:
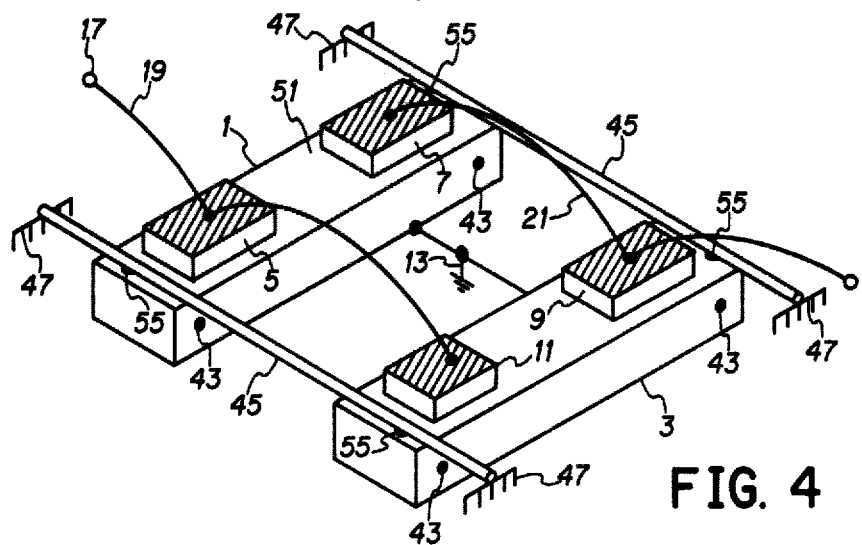

In FIG. 4, to which reference should now be made, the support rods 45 are connected between the resonator bars 1 and 3 and perform acoustic coupling between the two resonator bars. The rods are mounted on the top surfaces 51 of the resonator bars in parallel alignment with the nodal points 43. The rods can be soldered as shown at 55 to the bars or welded, braised or any other technique known in the Art.

Figure 5:
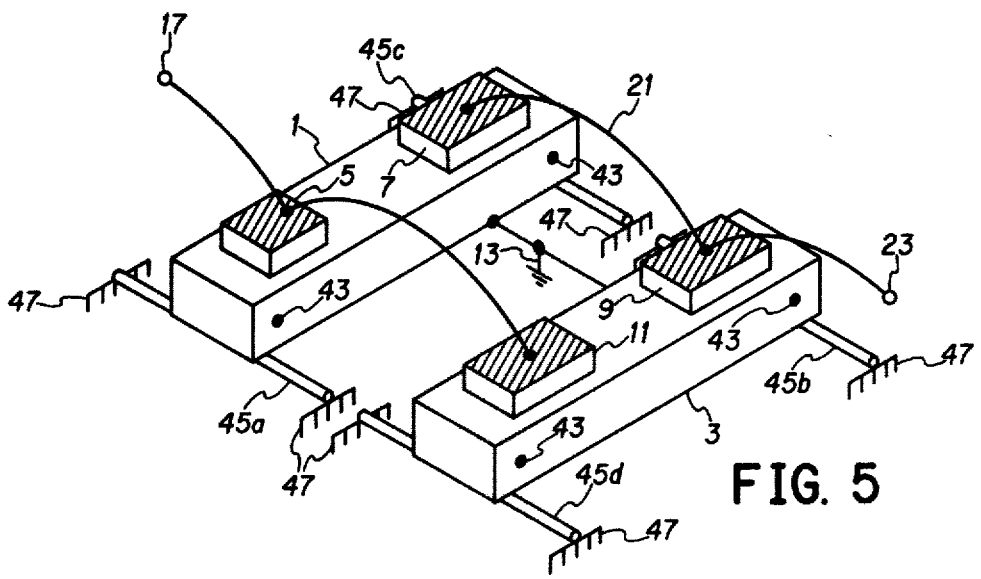

In FIG. 5, the support bars 45a, b, c, and d are mounted to the bottom of the resonator bars 1 and 3 and although they could join the resonator bar 1 with resonator bar 3 and provide acoustic coupling this embodiment shows the bars are only used for support purposes. The support rods are connected to the bottom of the resonator bars in parallel alignment with the nodal point 43.

The operation of the mechanical bandpass filter can be understood by referring again to FIG. 1 and FIG. 8a. The resonator 1 is tuned to be resonant at the low passband frequency $f_1$ and in the case of FIG. 8a the $f_1$ frequency is approximately 5.025 KHz as indicated at point 59 of curve 57. The resonator bar 3 resonates at the upper passband frequency $f_2$ which in the case of FIG. 8a is approximately 5.138 and is indicated at point 61 of curve 57. It should be pointed out that this tuning is quite different from the conventional acoustically coupled case where both resonators are tuned to the same frequency which is near the lower edge of the passband.

The input signal between terminals 17 and 13 excites the two resonators 1 and 3 through the piezoelectric-ceramic transducers 5 and 11. The two resonators are tuned to different frequencies as mentioned earlier. Resonator 1 is tuned close to the lower edge of the passband $f_1$ which is indicated as point 59 on FIG. 8 and resonator 3 is tuned close to the upper edge of the passband $f_2$ which is indicated at point 61 in FIG. 8a. The output voltage is generated across transducers 7 and 9 where the polarity of the transducer 9 is reversed in the sense that expansion of the material results in the opposite polarity of the generated voltage as compared to transducer 11 and for that matter 5 and 7 also. In other words, the poled piezoelectric-ceramic transducer 9 has been "flipped-over" with respect to the three other transducers 5, 7 and 11. When an input signal is applied to the filter of a frequency of either that represented by point 67 or point 69 on FIG. 8a there is a cancelling effect caused by the opposite polarity voltage being generated by transducers 7 and 9. The further the frequency is removed from the passband, the area between points 59 and 61, on FIG. 8a the greater the cancellation. Conversely, as the frequency of the signal approaches the frequency of the passband as increasing the frequency from point 67 to point 59 of curve 57, as an example, the amplitude of the vibration of the resonator bar 1, which is the bar tuned nearest to the frequency at point 59, will increase and the output voltage will also increase because the difference between the voltage across transducer 9 and transducer 7 will become greater. Midway between the $f_1$ point and the $f_2$ points as indicated by points 59 and 61 on FIG. 8, which is also the center frequency 71, the resonator bars 1 and 3 are on the opposite side of their resonance curves and therefore are vibrating out of phase which means that the voltage generated by transducers 7 and 9 is in phase. The amplitudes are out of phase but so are the polarities of the transducers. As the frequency approaches the $f_2$ point 61 the resonator bar 3's amplitude becomes quite large with respect to the amplitude of resonator bar 1 and the output voltage is maintained at a high amplitude signal or low attenuation. In the cases where the frequency varies from the $f_2$ points at 61 to point 69 both resonator bars are vibrating in phase but because transducers 7 and 9 have opposite polarities the output signals tend to cancel.

The electrical-mechanical coupling between the transducers can be explained automatically as the ratio of the capacitance of the transducer, $C_o$ which is the capacitance that would be measured by a capacitance meter at a low frequency, to the acoustic capacitance of the resonator, $C_1$. This ratio is equal to $k_{em}^2$ or mathematically $k_{em}^2 = (C_o/C_1)$, where $k_{em}$ is the electromechanical coupling coefficient. It is possible by varying the sizes of one of the ceramic transducers to change both the electro-mechanical coupling coefficient $k_{em}$ and the transducer capacitance $C_o$. Given this information reference should be made to FIGS. 4 and 5, in particular, to transducers 5 and 11 of the figures. If the length of the transducer 11, which is the higher frequency transducer is decreased as shown in FIG. 4, or if the length of the lower frequency transducer 5 is increased, the frequency response of FIG. 8c is obtained. Increasing the transducer 5's length results in an increase in both $k_{em}$ and $C_o$ which results in an attenuation pole 65 of FIG. 8c. This provides very high attenuation above the filter passband at the frequency $f_{\infty 2}$ which in the example of FIG. 8c is approximately 5.6 KHz. This improves the selectivity of the filter in the region of $f_{\infty 2}$ which may be important in some applications.

The response curve for FIG. 1 where $C_o$ and $k_{em}$ are identical for all transducers is illustrated in FIG. 8a.

Conversely, by reducing $C_o$ and $k_{em}$ of the transducer 5 of the lower frequency resonator the attenuation pole $f_{\infty 1}$ shown in FIG. 9 at 63 falls below the filter passband. The changing of the coupling coefficients or $C_o$ individually gives the same results as shown in FIGS. 8a and 8c and the embodiments are shown in the comparison of FIG. 1 to FIGS. 4 and 5.

Although the embodiments presented in FIGS. 4 and 5 only show the changing of the transducer capacitance $C_o$ by varying the length of the transducer, a similar effect may be achieved by varying the thickness of the transducer. Both phenomenon may be expressed mathematically by $$C_o = \frac{K\epsilon_o A}{d}$$

where K is the dielectric constant of the transducer, $\epsilon_o$ is the permittivity constant, A is the area of the conductors 75 and d is the thickness of the transducer between the conductors 75. Therefore, by decreasing d, $C_o$ increases and increasing d, causes $C_o$ to decrease. Similarly, the changing of A causes a change in $C_o$ as was discussed above.

In the case where it is desired to have attenuation poles in both the upper and lower stopbands reference should be made to FIGS. 3 and 8d. The bridging capacitor 40 is connected from the input terminal 17 to the output terminal 23. Again the polarities of the transducers 5, 7 and 11 are identical and transducer 9 has an opposite polarity. In FIG. 8d there is a lower stopband pole $f_{\infty 1}$ shown at point 63 and an upper stopband pole $f_{\infty 2}$ shown at point 65. The position of the stopband poles 63 and 65 are determined by the value of the bridging capacitor 40 and the coupling coefficient and capacitance value ratios. The basic concept is as follows. With all of the transducer capacitance $C_o$ for the transducers and electro-mechanical coupling coefficients $k_{em}$ equal, a response similar to that shown in FIG. 8a is obtained. In FIG. 8d where there is a bridging capacitor 40, the attenuation pole frequencies are nearly but not quite symmetrically spaced around the center frequency 71 of the filter. When $C_o$ or $k_{em}$ or both are changed the response curve pole at point 63 and the pole at point 65 will change frequency. For example, if the length of the transducer of the higher frequency resonator 3 is increased then the $f_{\infty 1}$ point of FIG. 8b is brought closer to the $f_1$ point 59 while the $f_{\infty 2}$ point 65 will move out from the passband. Therefore, through the use of bridging capacitors and transducer size variation controllable response shapes can be achieved.

FIGS. 8a and b are the response curves of a basic bandpass filter that has two FE-NI metal alloy bar resonators 1.150 inches in length by a width of 0.100 inch and a thickness of 0.0245 inch. The piezoelectric-ceramic transducer is 0.450 inch in length by a width of 0.100 inch and a thickness of 0.0125 inch.

FIG. 8d is the response curve of the above described filter with a 10 picofarad capacitor placed between the input terminal and the output terminal.

FIG. 8b is the response curve of the basic bandpass filter that has low frequency input transducers (transducer 5 of FIG. 5) being 20% shorter in length than the other three transducers and consequently the shorter transducer's capacitance was 20% less than the other transducer's capacitance.

FIG. 8c is a computer predicted response curve of the basic bandpass filter with the high frequency resonator bar's input transducer (transducer 11 of FIG. 4) being shorter than the three other transducer by approximately 20% and consequently the transducer's capacitance is reduced by 20%.

Figure 6:
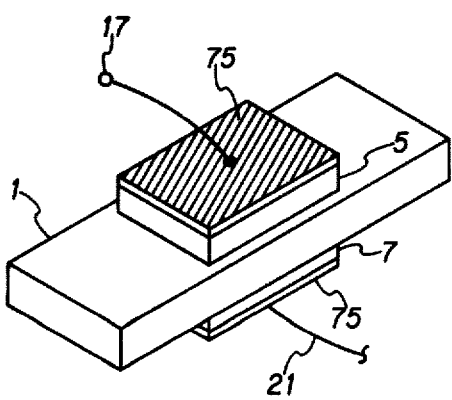
FIGS. 6 and 7 illustrate the placement of the transducers on the bar resonator.
Figure 7:
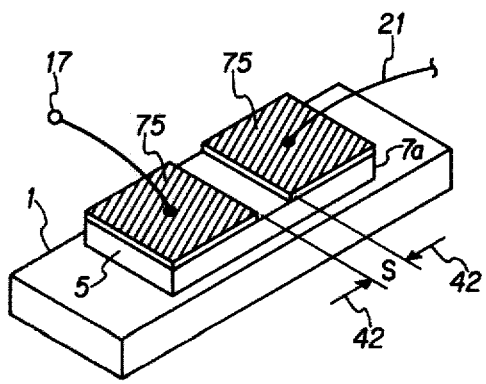

The configuration of FIG. 6 to which reference should be made and where transducer 5, as an illustration is mounted on the top surface of the resonator bar 1 and transducer 7 is mounted on the bottom surface of the resonator 1, is used for a wide bandwidth design where a maximum amount of piezoelectric-ceramic transducer is needed. The configurations shown in FIGS. 3, 4 or 5 are used for designs requiring good temperature characteristics because a minimum amount of ceramic material is used. In FIG. 7 there is only a single piece of ceramic material used and the bridging capacitance 40 can be realized by controlling the separations as indicated by arrows 42. This separation is only in the conductive material 75 that is affixed to the top of the ceramic material and can be used to provide the same results as the bridging capacitor 40 of FIG. 3. The configuration of FIGS. 6 and 7 although only shown for resonator bar 1 are equally applicable to resonator bar 3.

The disclosed bandpass filter provides a wider bandwidth by electrical or electro-mechanically coupling two bar resonators together that are designed to resonate at different frequencies. Greater stopband attenuation can be achieved by using transducers with selective but unequal capacitance or by bridging the input terminal of the transducer to the output terminal of the transducer with a bridging capacitor.

Many changes and modifications in the above described embodiment of the invention can, of course, be carried out without departing from the scope thereof. Accordingly, to promote the progress and science in useful arts, the invention is disclosed and is intended to be limited only by the scope of the appended claims.

I claim:

1. A mechanical bandpass filter, comprising:
   a first resonator means for resonating at a first frequency $f_1$ having a first nodal point and a second nodal point around which the first resonator means flexes;
   a second resonator means for resonating at a second frequency $f_2$ having a first nodal point and a second nodal point around which the second resonator means flexes;
   means for acoustically connecting the first resonator means to the second resonator means;
   means for applying an electrical signal to the first resonator means:
   means for coupling the electrical signal from the first resonator means to the second resonator means; and
   means for removing the electrical signal from the second resonator.

2. The mechanical bandpass filter according to claim 1, wherein the first resonator means and the second resonator means each comprises:
   a resonator bar; and
   a first and second piezoelectric transducer, the first piezoelectric transducer being mounted to a first surface of the resonator bar and the second piezoelectric transducer being mounted to a second surface opposite the first surface of the resonator bar.

3. The mechanical bandpass filter according to claim 1 wherein the first resonator means and the second resonator means each comprises:
   a resonator bar;
   a first and second piezoelectric transducer, each transducer being mounted to a first surface of the resonator bar and separated from each by a preselected distance.

4. The mechanical bandpass filter according to claim 1 wherein the first resonator means and the second resonator means each comprises:
   a resonator bar; and
   a first piezoelectric transducer with a first conductive plate on a first member of two surfaces of the first piezoelectric transducer, the two surfaces being in parallel alignment with each other and the first conductive plate being split into two separate plates separated from each other by a predetermined distance and a second conductive plate on a second member of the two surfaces being also affixed to the resonator bar.

5. The mechanical bandpass filter according to claim 1 wherein the first resonator means and the second resonator means comprises:
   a first resonator bar;
   a first transducer pair mounted to the first resonator bar and each member of the transducer pair being polled in the same direction;
   a second resonator bar; and
   a second transducer pair mounted to the second resonator bar and each member of the second transducer pair being polled in the opposite direction.

6. The mechanical bandpass filter according to claim 5 further comprising:
   a means for providing an attenuation pole to signals having a frequency less than the first frequency $f_1$.

7. The mechanical bandpass filter according to claim 6 wherein the first transducer pair comprises:
   an output transducer of a given capacitance and an input transducer of a capacitance less than the given capacitance.

8. The mechanical bandpass filter according to claim 6 wherein the second transducer pair comprises:
   an output transducer of a given capacitance and an input transducer of a capacitance greater than the given capacitance.

9. The mechanical bandpass filter according to claim 5 further comprising:
   a means for providing an attenuation pole to signals having a frequency greater than the second frequency $f_2$.

10. The mechanical bandpass filter according to claim 9 wherein the first transducer pair means further comprises:
    an output transducer of a given capacitance, and an input transducer of a capacitance greater than the given capacitance.

11. The mechanical bandpass filter according to claim 9 wherein the second transducer pair comprises:
    an output transducer of a given capacitance, and an input transducer having a capacitance less than the given capacitance.

12. The mechanical bandpass filter according to claim 1 further comprising:
    a means for providing a first attenuation pole to signals of a frequency less than the first frequency $f_1$ and a means for providing a second attenuation pole to signals of a frequency greater than the second frequency $f_2$.

13. The mechanical bandpass filter according to claim 12 comprising:
    a capacitance coupled between the means for applying the electrical signal to the first resonator means to the means for removing the electrical signal from the second resonator means.

14. The mechanical bandpass filter according to claim 1 further comprising:
    a means for providing an attenuation pole to signals having a frequency less than the first frequency $f_1$.

15. The mechanical bandpass filter according to claim 1 further comprising:
    a means for providing an attenuation pole to signals having a frequency greater than the second frequency $f_2$.

16. The mechanical bandpass filter according to claim 1 wherein the means for acoustically connecting the first resonator means to the second resonator means comprises:
    a first support rod;
    a second support rod;
    means for connecting a first support rod between the first nodal point of the first resonator means and the first nodal point of the second resonator means; and
    means for connecting the second support rod between the second nodal point of the first resonator means and the second nodal point of the second resonator means.

17. The mechanical bandpass filter according to claim 1 wherein the means for acoustically connecting the first resonator means to the second resonator means comprises:
    a first support rod;
    a second support rod;
    means for connecting the first support rod between a top surface in parallel alignment with the first nodal point of the first resonator means and a top surface in parallel alignment with the first nodal point of the second resonator means; and
    means for connecting the second support rod between the top surface in parallel alignment with the second nodal point of the first resonator means and to the top surface in parallel alignment with the second nodal point of the second resonator means.

18. The mechanical bandpass filter according to claim 1 wherein the means for acoustically connecting the first resonator means to the second resonator means comprises:
    a first support rod;
    a second support rod;
    means for connecting a first support rod between a bottom surface in parallel alignment with the first nodal point of the first resonator means and a bottom surface in parallel alignment with the first nodal point of the second resonator means; and
    means for connecting the second support rod between the bottom surface in parallel alignment with the second nodal point of the first resonator means and the bottom surface in parallel alignment with the second nodal point of the second resonator means.

* * * * *